(12) United States Patent
Sato

(10) Patent No.: US 8,653,620 B2
(45) Date of Patent: Feb. 18, 2014

(54) BACK SIDE ILLUMINATION TYPE SOLID STATE IMAGING DEVICE AND METHOD OF MANUFACTURING THE SAME

(75) Inventor: Maki Sato, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 275 days.

(21) Appl. No.: 13/235,405

(22) Filed: Sep. 18, 2011

(65) Prior Publication Data

US 2012/0146116 A1 Jun. 14, 2012

(30) Foreign Application Priority Data

Dec. 8, 2010 (JP) ................................. 2010-273315

(51) Int. Cl.
*H01L 31/00* (2006.01)

(52) U.S. Cl.
USPC .......................................... 257/460; 257/447

(58) Field of Classification Search
CPC .................... H01L 31/0224; H01L 31/022408; H01L 27/14636; H01L 27/1464; H01L 27/146
USPC ................................................ 257/447, 460
See application file for complete search history.

(56) References Cited

U.S. PATENT DOCUMENTS

| | | | |
|---|---|---|---|
| 8,420,438 B2* | 4/2013 | Hynecek et al. | 438/98 |
| 2008/0217724 A1* | 9/2008 | Uya | 257/460 |
| 2010/0148289 A1* | 6/2010 | McCarten et al. | 257/432 |
| 2011/0049336 A1* | 3/2011 | Matsunuma | 250/214.1 |
| 2013/0001733 A1* | 1/2013 | Watanabe | 257/447 |

FOREIGN PATENT DOCUMENTS

| | | |
|---|---|---|
| JP | 2005-268238 | 9/2005 |
| JP | 2008-28677 | 2/2008 |

* cited by examiner

*Primary Examiner* — Yu-Hsi D Sun
(74) *Attorney, Agent, or Firm* — Oblon, Spivak, McClelland, Maier & Neustadt, L.L.P.

(57) ABSTRACT

According to one embodiment, an imaging device includes a semiconductor substrate having a first conductivity type, a well region which is arranged on a front surface side of the semiconductor substrate and has the first conductivity type, photodiodes which are arranged in the well region and have a second conductivity type, a diffusion layer which is arranged between the photodiodes, supplies a potential to the well region, and has the first conductivity type, an overflow drain layer which is arranged on a back surface side of the semiconductor substrate and has the second conductivity type, an overflow drain electrode which extends from the front surface side of the semiconductor substrate to the overflow drain layer and supplies a bias potential to the overflow drain layer from the front surface side of the semiconductor substrate, and a wiring layer which is arranged on the front surface of the semiconductor substrate.

20 Claims, 15 Drawing Sheets

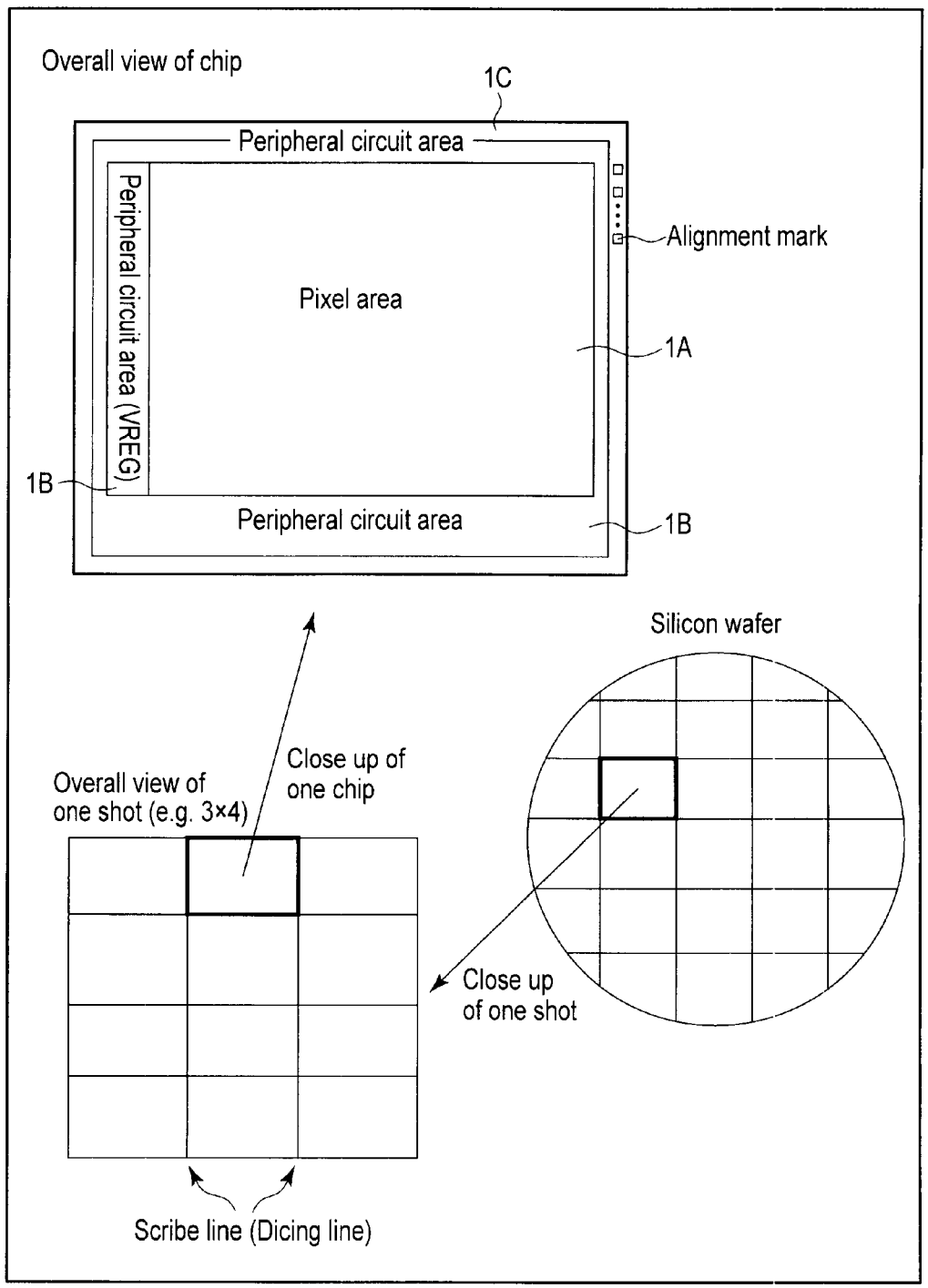
F I G. 1

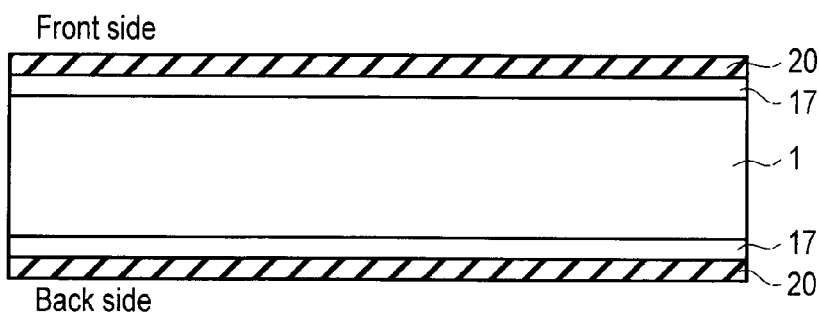
F I G. 1 0 C
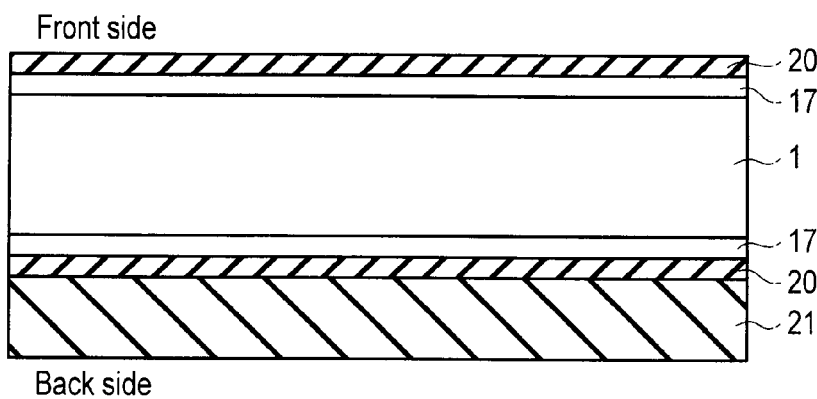
F I G. 1 0 D
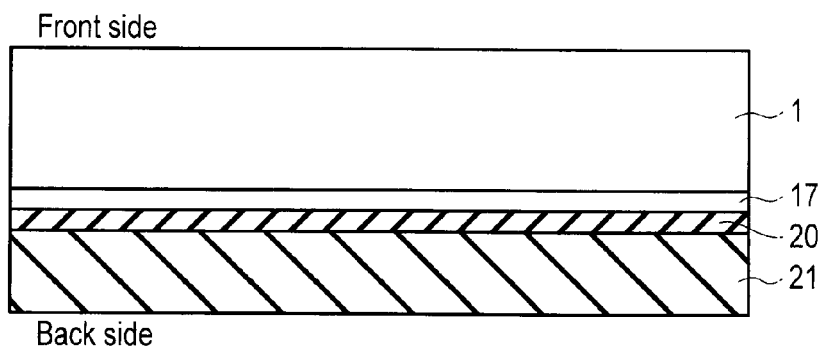
F I G. 1 0 E

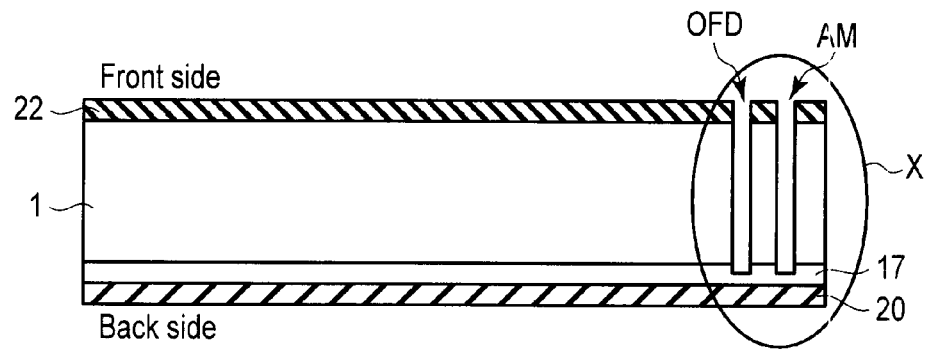
F I G. 10 I
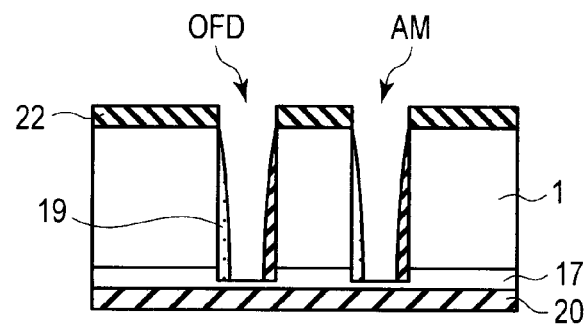
F I G. 10 J
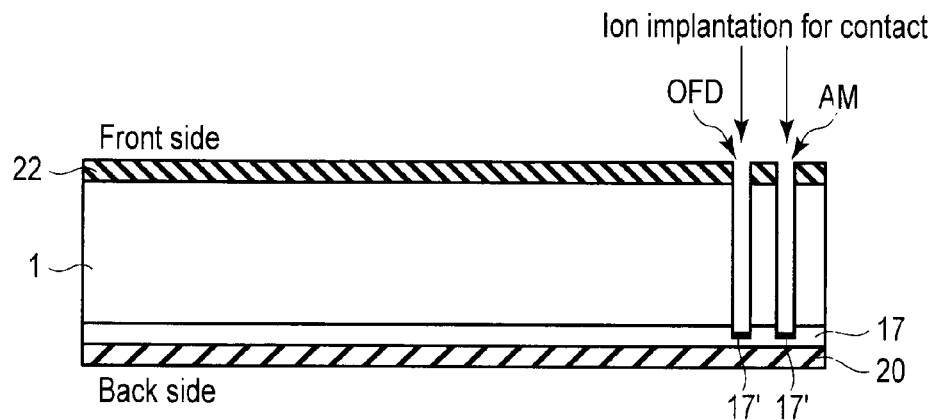
F I G. 10 K

BACK SIDE ILLUMINATION TYPE SOLID STATE IMAGING DEVICE AND METHOD OF MANUFACTURING THE SAME

CROSS-REFERENCE TO RELATED APPLICATIONS

This application is based upon and claims the benefit of priority from prior Japanese Patent Application No. 2010-273315, filed Dec. 8, 2010, the entire contents of which are incorporated herein by reference.

FIELD

Embodiments described herein relate generally to a back side illumination type solid state imaging device and a method of manufacturing the same.

BACKGROUND

As solid state imaging devices (e.g., a CMOS image sensor), there are two types, i.e., a front side illumination type (an FSI type) and a back side illumination type (a BSI type).

In the front side illumination type, a back gate electrode is provided on an entire back surface of a semiconductor substrate, and a potential can be supplied to the semiconductor substrate from this back gate electrode. However, in recent years, to solve a problem of a reduction in sensitivity involved by high pixilation, the back side illumination type, the sensitivity of a light receiving portion thereof of which is not affected by a wiring layer, is becoming mainstream.

In the back side illumination type, since color filters are provided on the back surface of the semiconductor substrate, a potential cannot be supplied to the semiconductor substrate from the back surface side of the semiconductor substrate. Therefore, an electrode configured to supply a potential to the semiconductor substrate is necessarily partially provided on a front surface side of the semiconductor substrate on which the wiring layer is provided. However, since the semiconductor substrate has a large resistance, it is difficult to stabilize the potential in the semiconductor substrate by this configuration alone.

BRIEF DESCRIPTION OF THE DRAWINGS

FIG. 1 is a view showing a pixel area in a peripheral circuit area;

DETAILED DESCRIPTION

Figure 2:
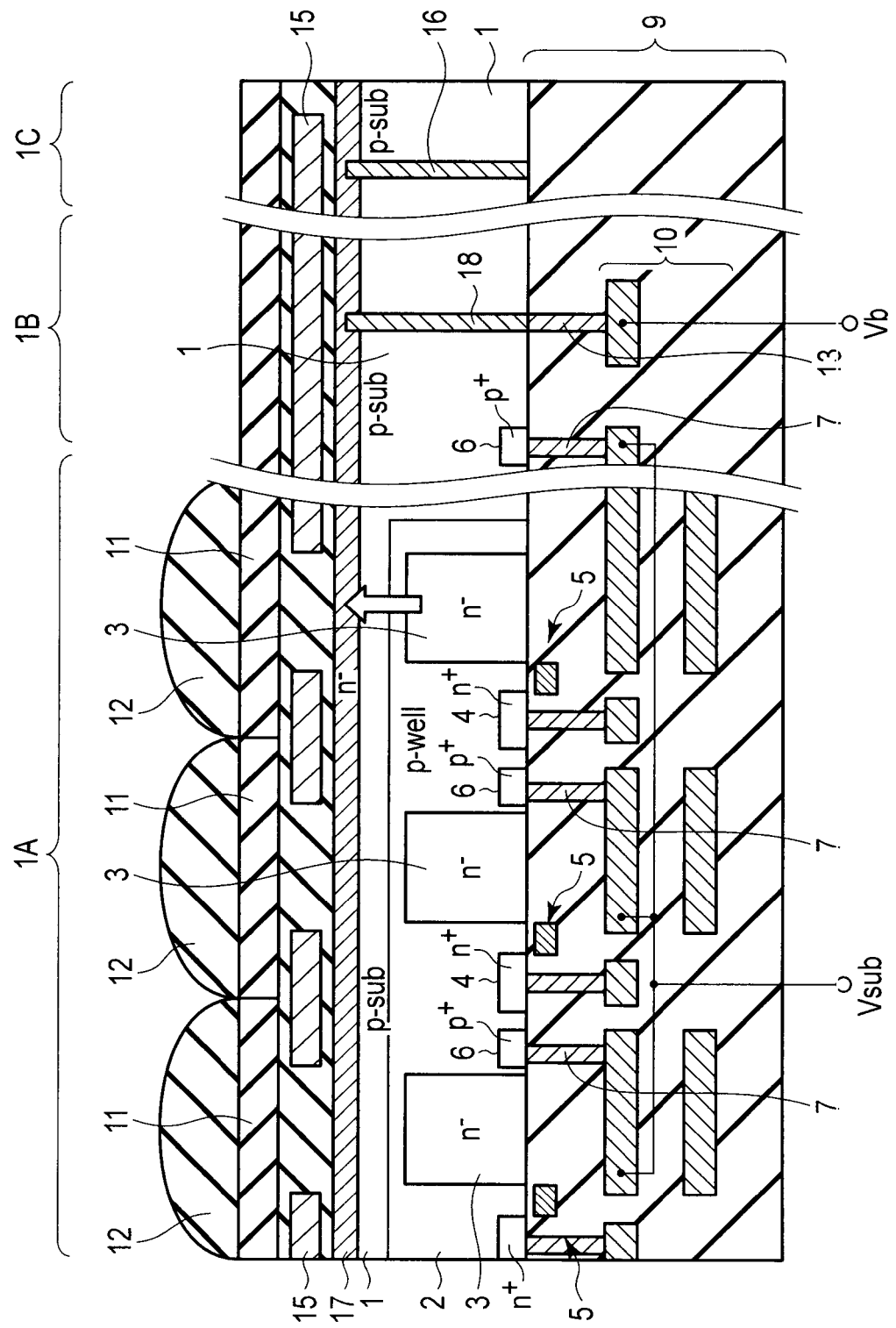
FIG. 2 is a view showing a first embodiment of a back side illumination type solid state imaging device.

In general, according to one embodiment, a back side illumination type solid state imaging device comprising: a semiconductor substrate having a first conductivity type; a well region which is arranged on a front surface side of the semiconductor substrate and has the first conductivity type; photodiodes which are arranged in the well region and have a second conductivity type; a diffusion layer which is arranged between the photodiodes, supplies a potential to the well region, and has the first conductivity type; an overflow drain layer which is arranged on a back surface side of the semiconductor substrate and has the second conductivity type; an overflow drain electrode which extends from the front surface side of the semiconductor substrate to the overflow drain layer and supplies a bias potential to the overflow drain layer from the front surface side of the semiconductor substrate; and a wiring layer which is arranged on the front surface of the semiconductor substrate.

A read circuit of a solid state imaging device is constituted of pixel cells and a load circuit and has a function of reading an electric charge stored in a photodiode. The electric charge in the photodiode is transferred to a floating diffusion, and it is converted into a signal voltage by a source follower circuit constituted of a row selection transistor, an amplification transistor, and a load circuit.

Here, as one technology that discharges an electric charge overflowing from a photodiode in one pixel before this electric charge enters another pixel and thereby avoids blooming (color mixture), there is a vertical overflow drain configuration. It can be said that this configuration is a very effective technology for avoiding interference between pixels under conditions that a potential in the semiconductor substrate is stable.

However, in a front side illumination type solid state imaging device, a back gate electrode can be provided on a back surface side of a semiconductor substrate. Therefore, when a power supply potential VDD (e.g., 2.8 V) is supplied as a bias potential Vb, the potential in the semiconductor substrate can be stabilized, and blooming can be avoided by the vertical overflow drain configuration.

However, in the back side illumination type solid state imaging device, since the bias potential Vb cannot be supplied from the back surface side of the semiconductor substrate, stabilizing the potential in the semiconductor substrate is difficult. As a result, even if the vertical overflow drain configuration is adopted in the back side illumination type solid state imaging device, the effect of avoiding blooming cannot be sufficiently obtained.

FIG. 1 shows a wafer, one shot, and a chip.

For example, to manufacture several hundred chips from one wafer, exposure of more than one shot is carried out with respect to the one wafer. In this example, 3×4 chips are transferred onto the wafer by one shot. The one shot includes chips and scribe lines between these chips. After a wafer process and before a packaging process, several hundred chips are manufactured by cutting the wafer along the scribe lines.

As shown in an overall view of the chip, in a solid state imaging device, a greater part in one chip corresponds to pixel area 1A, and peripheral circuit area 1B is arranged around pixel area 1A. That is, an area share ratio of pixel area 1A in the one chip is very high. Therefore, in the back side illumination type, the power supply potential VDD may possibly not be supplied to the semiconductor substrate at the center of pixel area 1A by an electrode provided in peripheral circuit area 1B alone due to the resistance of the semiconductor substrate.

Thus, this embodiment suggests a novel vertical overflow drain configuration that can stabilize a potential in a semiconductor substrate in the back side illumination type solid state imaging device.

FIG. 2 shows a first embodiment of the back side illumination type solid state imaging device.

This embodiment is an example where semiconductor substrate 1 is of a p type and n-type photodiodes 3 are formed in this p-type semiconductor substrate 1. It is to be noted that counterchanging the n type and the p type results in an example that p-type photodiodes are formed in an n-type semiconductor substrate in this drawing.

This example illustrates n-type photodiodes 3 because these diodes are advantageous to a high-speed operation since the mobility of electrons is higher than the mobility of holes (which is also true in other embodiments).

P-type semiconductor substrate 1 is, e.g., a silicon substrate. Semiconductor substrate 1 includes pixel area 1A, peripheral circuit area 1B, and alignment mark area (scribe lines) 1C.

An $n^-$-type impurity layer, i.e., overflow drain layer 17 that realizes the vertical overflow drain configuration is arranged on a back surface side of semiconductor substrate 1.

Overflow drain layer 17 is arranged on the entire back surface of semiconductor substrate 1 and has a thickness of 0.05 μm to 0.3 μm, for example.

Figure 5:
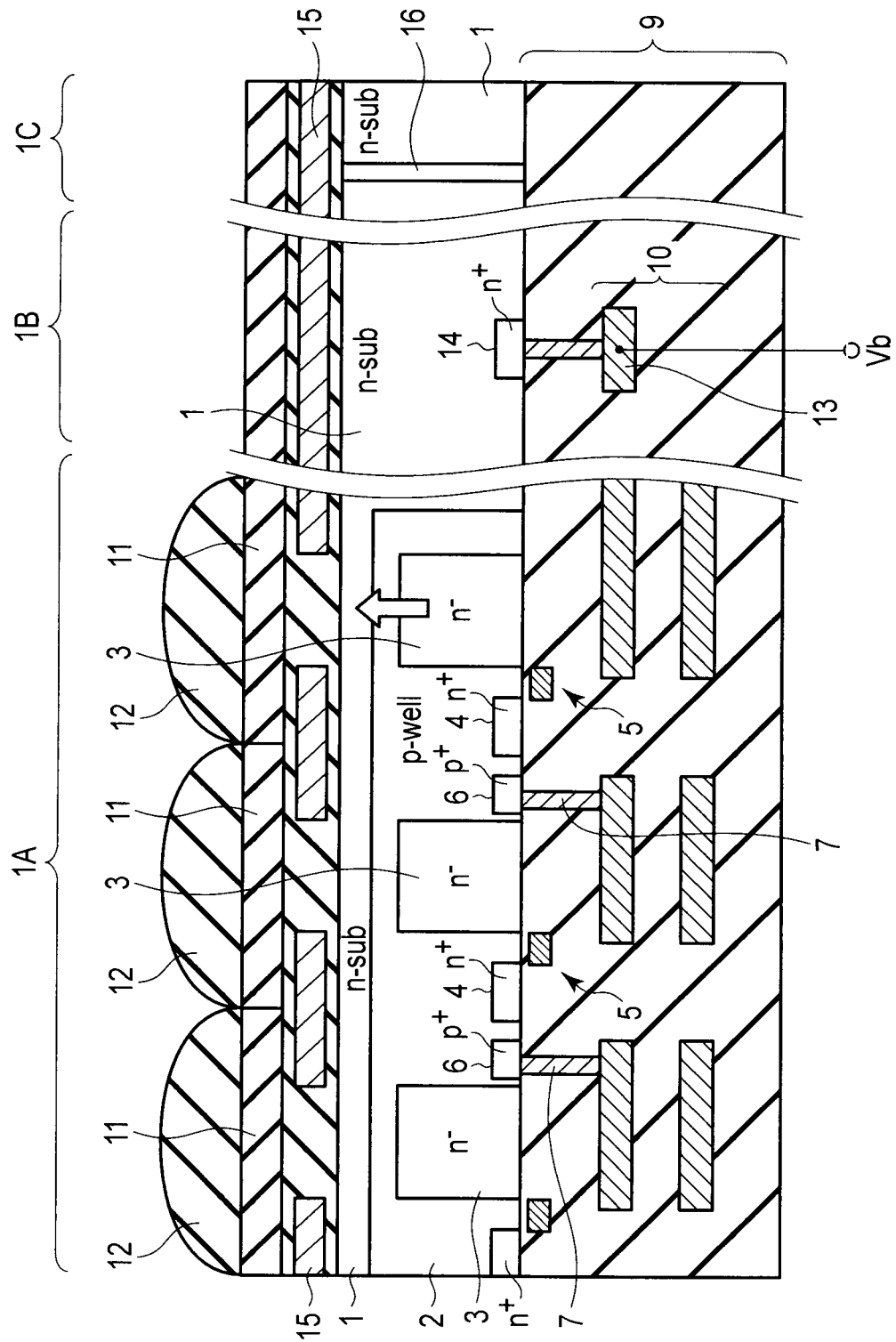
FIG. 5 and FIG. 6 are views each showing a back side illumination type solid state imaging device as a reference example.

In a conventional technology, for example, as shown in FIG. 5, semiconductor substrate 1 and photodiodes 3 have the same conductivity type (an n type), and well region 2 having a different conductivity type (a p type) is arranged between these members to realize the vertical overflow drain configuration.

On the other hand, in this embodiment, semiconductor substrate 1 and photodiodes 3 provided on the front surface side have different conductivity types, and overflow drain layer 17 having the same conductivity type as that of photodiodes 3 is arranged on the back surface side of semiconductor substrate 1 to realize the vertical overflow drain configuration.

Overflow drain layer 17 can be constituted of, e.g., a diffusion layer in semiconductor substrate 1 or a conductive layer on the back surface of the semiconductor substrate 1.

For example, in a batch process based on a CVD method, when forming a conductive silicon layer containing n-type impurities on the front surface side of the semiconductor substrate 1, the conductive silicon layer containing the n-type impurities also adheres to the back surface side of semiconductor substrate 1. Before forming the well, the transistors, the photodiodes, and others on the front surface side of semiconductor substrate 1 by utilizing such properties, the conductive silicon layer (overflow drain layer 17) containing the n-type impurities having a higher concentration than semiconductor substrate 1 can be formed on the back surface side of semiconductor substrate 1.

When overflow drain layer 17 is formed on the back surface side of semiconductor substrate 1 in this manner, the vertical overflow drain configuration can be adopted in the back side illumination type solid state imaging device, and a potential in semiconductor substrate 1 can be also stabilized as will be described later.

In pixel area 1A, n-type photodiodes 3 and n-type floating diffusions 4 are formed in p-type semiconductor substrate 1. Further, each read transistor 5 reads an electric charge in photodiode 3 to floating diffusion 4.

Each electrode 7 that supplies a potential to p-type semiconductor substrate 1 is connected to each high-concentration $p^+$-type diffusion layer 6 configured for substrate contact. A substrate potential Vsub is applied to p-type semiconductor substrate 1 through electrodes 7 and $p^+$-type diffusion layers 6.

Here, an important point is that providing overflow drain layer 17 enables providing electrodes 7 in pixel area 1A. For example, in pixel area 1A, when one $p^+$-type diffusion layer (substrate contact portion) is provided for one pixel, a potential in p-type semiconductor substrate 1 can be stabilized through p-type well region 2.

Wiring layer 9 is formed on the front surface side of semiconductor substrate 1. Since light enters photodiodes 3 from the back surface side of semiconductor substrate 1, conductive lines 10 can be provided on the entire front surface side of semiconductor substrate 1.

In peripheral circuit area 1B, overflow drain electrode 18 extends toward overflow drain layer 17 from the front surface side of semiconductor substrate 1 and electrically comes into contact with overflow drain layer 17. Electrode 13 provided on the front surface side of semiconductor substrate 1 is in contact with overflow drain electrode 18.

Therefore, when a bias potential Vb is applied to electrode 13, the bias potential Vb is transmitted to overflow drain layer 17 through overflow drain electrode 18.

As a result, the vertical overflow drain configuration is realized.

It is to be noted that overflow drain electrode 18 may be a piercing electrode that pierces semiconductor substrate 1, but a desirable configuration is that overflow drain electrode 18 does not pierce overflow drain layer 17, i.e., an end portion of overflow drain electrode 18 is present in overflow drain layer 17.

That is because an insulating layer is formed on a side surface of overflow drain electrode 18.

Meanwhile, in the back side illumination type solid state imaging device, color filters 11 and microlenses 12 are arranged on the back surface side of semiconductor substrate 1. Further, to lead light to photodiodes 3 alone, light shielding film 15 having openings above photodiodes 3 is provided between semiconductor substrate 1 and color filters 11.

Therefore, in semiconductor substrate 1, alignment mark 16 is provided in alignment mark area 1C. This alignment mark 16 is used as a positioning member when disposing color filters 11, microlenses 12, and light shielding film 15 to the back surface side of semiconductor substrate 1. Furthermore, alignment mark 16 is constituted of a deep trench that extends from the front surface side to the back surface side of semiconductor substrate 1 so that alignment mark 16 can be recognized from the back surface side of semiconductor substrate 1.

Thus, when alignment mark 16 has the same structure as overflow drain electrode 18 and they are simultaneously formed, the novel vertical overflow drain configuration can be realized without a great increase in cost due to an increase in the number of manufacturing steps.

Figure 3:
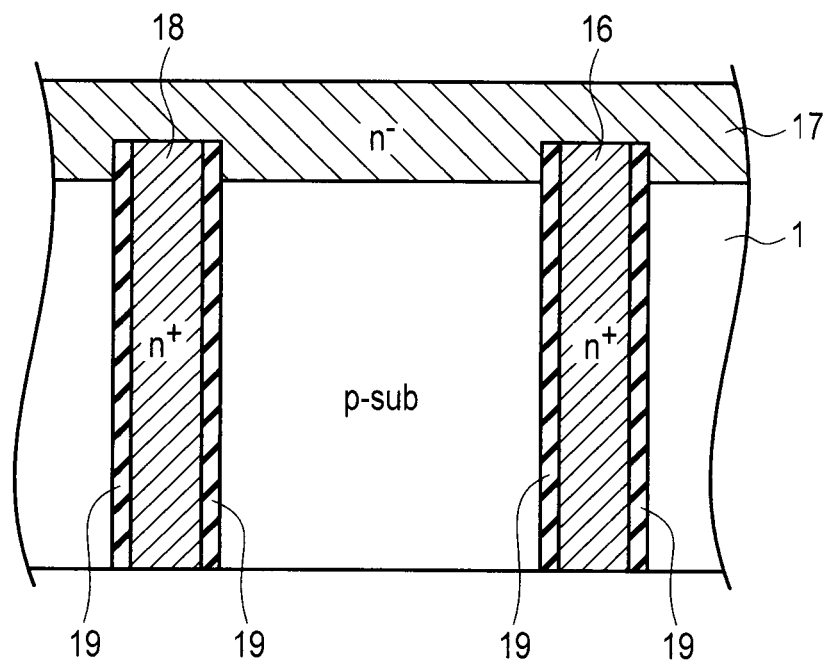
FIG. 3 is a view showing an overflow drain electrode.

For example, as shown in FIG. 3, each of alignment mark 16 and overflow drain electrode 18 can be constituted of a conductive silicon layer (an $n^+$-type impurity layer) containing n-type impurities filling each trench in semiconductor substrate 1. Insulating layer (e.g., a silicon oxide layer) 19 configured to insulate the conductive silicon layer from semiconductor substrate 1 is arranged on an inner surface of the trench in semiconductor substrate 1.

It is to be noted that each of alignment mark 16 and overflow drain electrode 18 may be made of a metal or an alloy. Moreover, it is desirable to provide insulating layer 19 on the trench inner surface, but insulating layer 19 may be omitted.

Meanwhile, in general, a single crystal of Si containing no impurity (i.e., an intrinsic semiconductor silicon single crystal) has an equal concentration of electrons and holes, and approximately $1\times10^{10}$ cm$^{-3}$ of this single crystal is subjected to doping. It is known that a resistivity of the nearly intrinsic semiconductor silicon single crystal at this time is approximately 40 to 60 kΩ·cm, and the resistance value is lowered in terms of LogScale when the impurity concentration is increased from here, i.e., the resistivity (Ohm·cm) becomes $\frac{1}{10}$ when the number of atoms of impurities is decupled. Thus, apparent substrate resistance is reduced by increasing the impurity concentration in the overflow drain layer.

For example, in the first embodiment, when overflow drain layer 17 is constituted of a conductive silicon layer containing impurities, overflow drain layer 17 is manufactured to have the impurity concentration higher than the impurity concentration of semiconductor substrate 1 (e.g., $1\times10^{13}$ cm$^{-3}$ to $1\times10^{20}$ cm$^{-3}$) and lower than the impurity concentration of source/drain diffusion layers of transistors (e.g., $1\times10^{19}$ cm$^{-3}$ to $1\times10^{20}$ cm$^{-3}$).

Moreover, when overflow drain electrode 18 is constituted of a conductive silicon layer containing impurities, it is desirable for the impurity concentration in overflow drain electrode 18 to be higher than the impurity concentration in overflow drain layer 17.

Additionally, an expression of resistance R is R=ρL/S, a resistance value is in inverse proportion to an area, and hence a larger layer thickness of the overflow drain layer is preferred, in order to reduce the apparent substrate resistance.

As described above, in the first embodiment, the vertical overflow drain configuration is constituted of n-type photodiodes 3, p-type semiconductor substrate 1, and n-type overflow drain layer 17. Since the substrate potential Vsub can be supplied to p-type semiconductor substrate 1 from electrodes 7 in pixel area 1A and peripheral circuit area 1B, the potential in semiconductor substrate 1 can be stabilized. Further, since the bias potential Vb can be supplied to overflow drain layer 17 from overflow drain electrode 18, electrons overflowing from photodiodes 3 can be discharged to overflow drain layer 17, thereby effectively preventing blooming.

Figure 4:
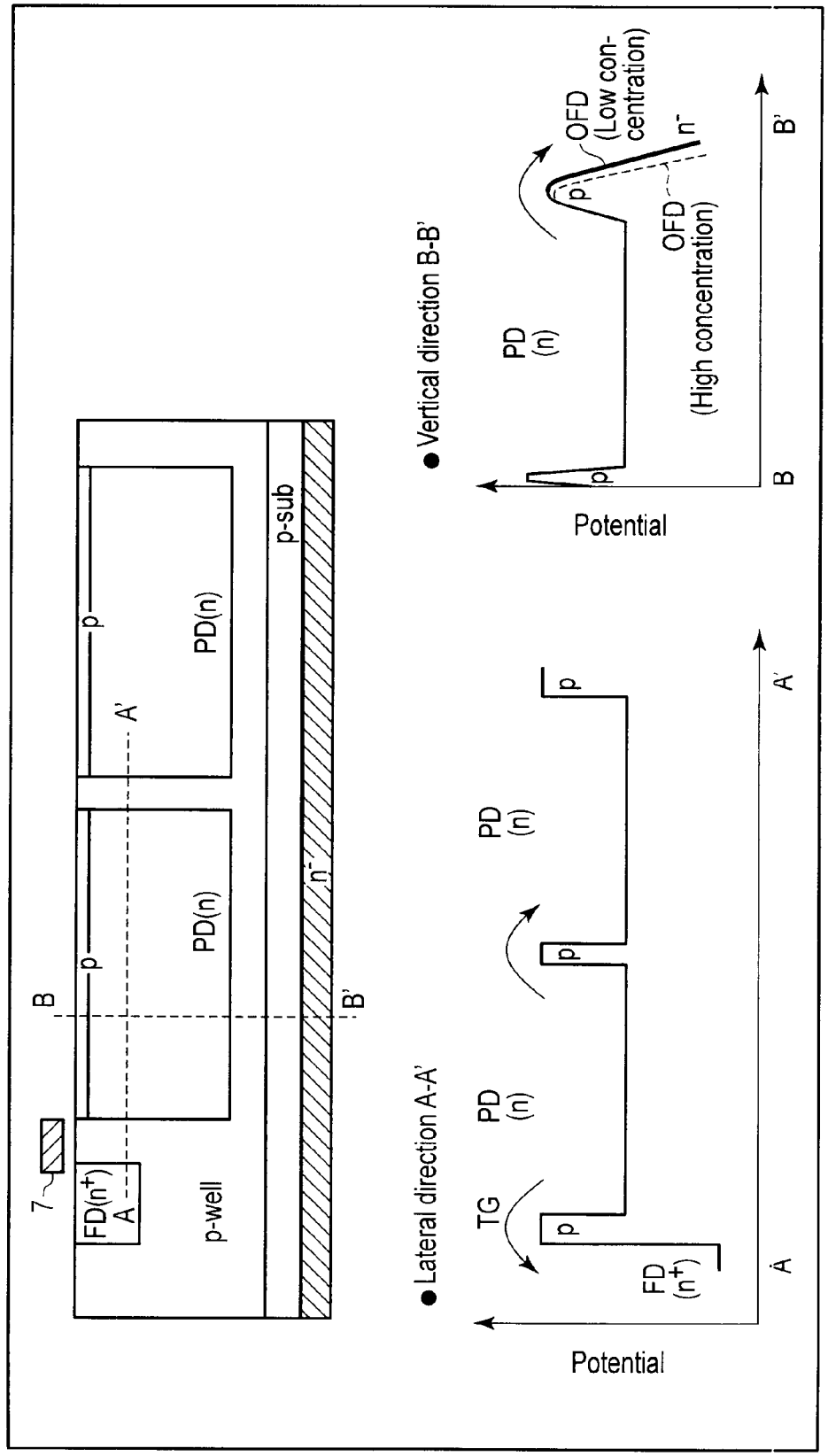
FIG. 4 is a view showing potential barriers in a vertical direction and a lateral direction of a photodiode.

However, as shown in FIG. 4, a vertical potential barrier of photodiodes 3 must be adjusted to be smaller than a lateral potential barrier of photodiodes 3.

For example, as shown in the drawing, when the impurity concentration of the overflow drain layer (OFD) is increased, the vertical potential barrier of photodiodes 3 is reduced, and hence a relationship between the vertical potential barrier and the lateral potential barrier can be adjusted by the impurity concentration of the overflow drain layer.

Further, it is necessary to assure a sufficient distance between the n-type well region in peripheral circuit area 1B and n-type overflow drain layer 17 in order to avoid latchup in peripheral circuit area 1B.

FIG. 5 shows the back side illumination type solid state imaging device as a reference example.

N-type semiconductor substrate 1 is, e.g., a silicon substrate, and an area on a front surface of semiconductor substrate 1 is constituted of pixel area 1A, peripheral circuit area 1B, and alignment nark area (a scribe line) 1C.

In pixel area 1A, p-type well region 2 is formed in n-type semiconductor substrate 1, and n-type photodiodes 3 are formed in p-type well region 2. Furthermore, n-type floating diffusions 4 are formed in p-type well region 2. Read transistors 5 read electric charges in photodiodes 3 to floating diffusions 4.

Electrodes 7 configured to supply a potential to p-type well region 2 are connected to high-concentration p$^+$-type diffusion layers 6 configured for well contact.

In peripheral circuit area 1B, electrode 13 configured to supply a potential to n-type semiconductor substrate 1 is connected to high-concentration n$^+$-type diffusion layer 14 configured for substrate contact. Although a CMOS logic circuit that controls read of a pixel signal from pixel area 1A is formed in peripheral circuit area 1B, description thereof will be omitted.

In alignment mark area (the scribe line) 1C, alignment mark 16 that can be recognized from a back surface of n-type semiconductor substrate 1 is formed in n-type semiconductor substrate 1. Alignment mark 16 is used for positioning color filters 11, microlenses 12, and light shielding film 15 on the back surface side of semiconductor substrate 1.

The back side illumination type solid state imaging device is characterized in that color filters 11 and microlenses 12 are arranged on the back surface side of semiconductor substrate 1. Moreover, to lead light to photodiodes 3 alone, light shielding film 15 having openings above photodiodes 3 is provided between semiconductor substrate 1 and color filters 11.

According to such a configuration, light receiving regions of photodiodes 3 are not narrowed by wiring layer 9 provided on the front surface side of semiconductor substrate 1, and the number of saturation electrons in photodiodes 3 can be increased, thereby realizing high sensitivity of photodiodes 3. Additionally, in wiring layer 9 on the front surface side of semiconductor substrate 1, conductive lines 10 can be freely laid out without being restricted to positions of photodiodes 3.

However, in the back side illumination type, since the number of saturation electrons in photodiodes 3 is high, blooming is apt to occur. That is, realization of high sensitivity and prevention of blooming have a tradeoff relationship.

Thus, to improve this tradeoff, adopting the vertical overflow drain configuration in the back side illumination type is very effective. That is because high sensitivity can be realized by the back side illumination, and blooming can be prevented by discharging electrons overflowing from photodiodes 3.

On the other hand, as described above, to effect the prevention of blooming by the vertical overflow drain configuration, the potential in semiconductor substrate 1 must be stabilized. However, the back side illumination type solid state imaging device is configured to take in light from the back surface side of semiconductor substrate 1, and hence a back gate electrode cannot be provided.

Therefore, as shown in the drawing, electrodes 13 configured to supply the potential to semiconductor substrate 1 are provided on the front surface side of semiconductor substrate 1, and the bias potential Vb is applied to semiconductor substrate 1 through electrodes 13 and high-concentration n$^+$-type diffusion layer 14.

However, on the front surface side of semiconductor substrate 1, since p-type well region 2 is present in pixel area 1A, electrodes 13 for semiconductor substrate 1 cannot be provided in this area. Therefore, electrodes 13 are partially provided in peripheral circuit area 1B on the front surface side of semiconductor substrate 1.

As a result, even if a power supply potential VDD (e.g., 2.8 V) is supplied as the bias potential Vb, the entire semiconductor substrate 1 cannot be stabilized at the power supply potential VDD due to the resistance of semiconductor substrate 1. As a result, it is difficult to satisfactorily obtain the effect of preventing blooming by the vertical overflow drain configuration.

Figure 6:
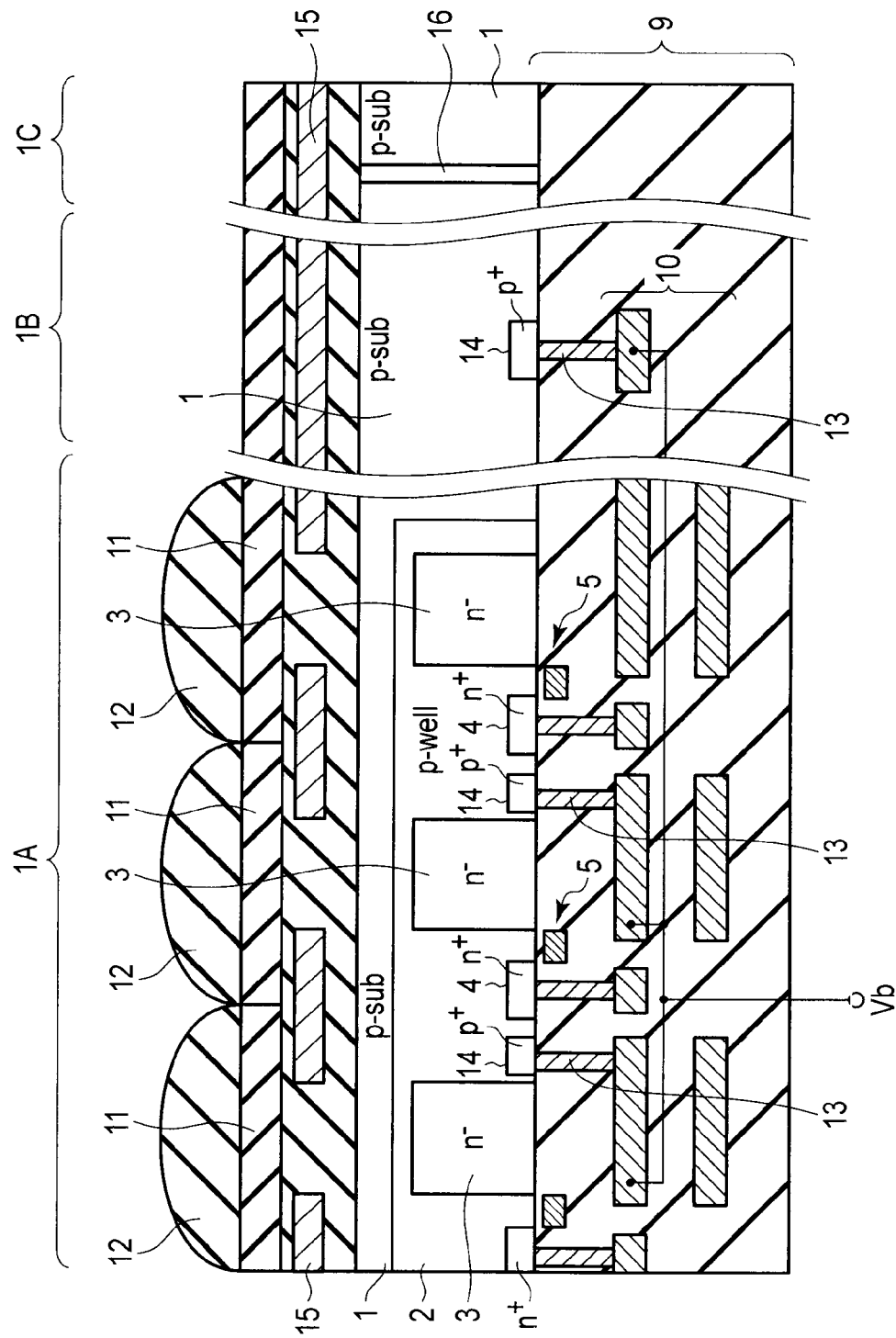

FIG. 6 shows a back side illumination type solid state imaging device as another reference example.

In the drawing, like reference numerals denote elements equal to those in the solid state imaging device depicted in FIG. 5, thereby omitting detailed description thereof.

This solid state imaging device is different from the solid state imaging device shown in FIG. 5 in that semiconductor substrate 1 is of a p type.

In this case, electrodes 13 that apply the bias potential Vb to p-type semiconductor substrate 1 through p-type well region 2 can be provided in pixel area 1A. For example, in pixel area 1A, one high-concentration p+-type diffusion layer (substrate contact portion) 14 can be provided with respect one pixel. Therefore, according to this configuration, the bias potential Vb can be supplied to the entire semiconductor substrate 1, which is effective to stabilize the potential in the semiconductor substrate 1.

However, since the solid state imaging device shown in this drawing does not have the vertical overflow drain configuration which is n-p-n or p-n-p in the vertical direction of the photodiodes, when electric charges in the photodiodes in one pixel overflow, they enter other pixels or floating diffusions, resulting in the occurrence of blooming.

Figure 7:
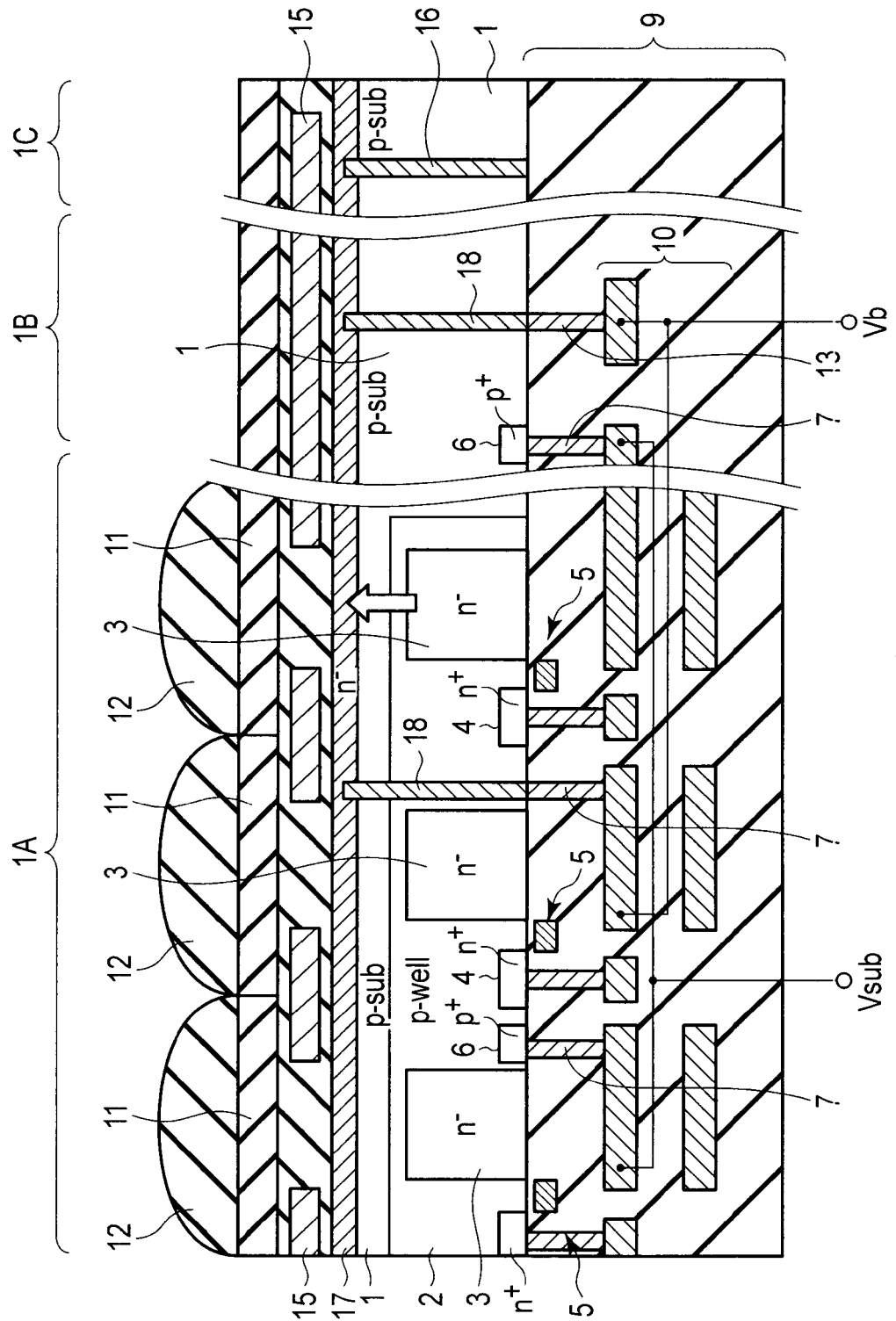
FIG. 7 is a view showing a second embodiment of the back side illumination type solid state imaging device.

FIG. 7 shows a second embodiment of the back side illumination type solid state imaging device.

This embodiment is a modification of the first embodiment (FIG. 2), and it is characterized in that overflow drain electrode 18 is also formed in pixel area 1A.

In the first embodiment, overflow drain electrode 18 is formed in peripheral circuit area 1B. On the other hand, in the second embodiment, overflow drain electrodes 18 are formed in pixel area 1A and peripheral circuit area 1B, respectively. As a result, a potential in overflow drain layer 17 can be stabilized.

Therefore, according to the second embodiment, in the back side illumination type solid state imaging device having the vertical overflow drain configuration, since potentials in semiconductor substrate 1 and overflow drain layer 17 can be stabilized, thus simultaneously realizing high sensitivity and prevention of blooming.

Figure 8:
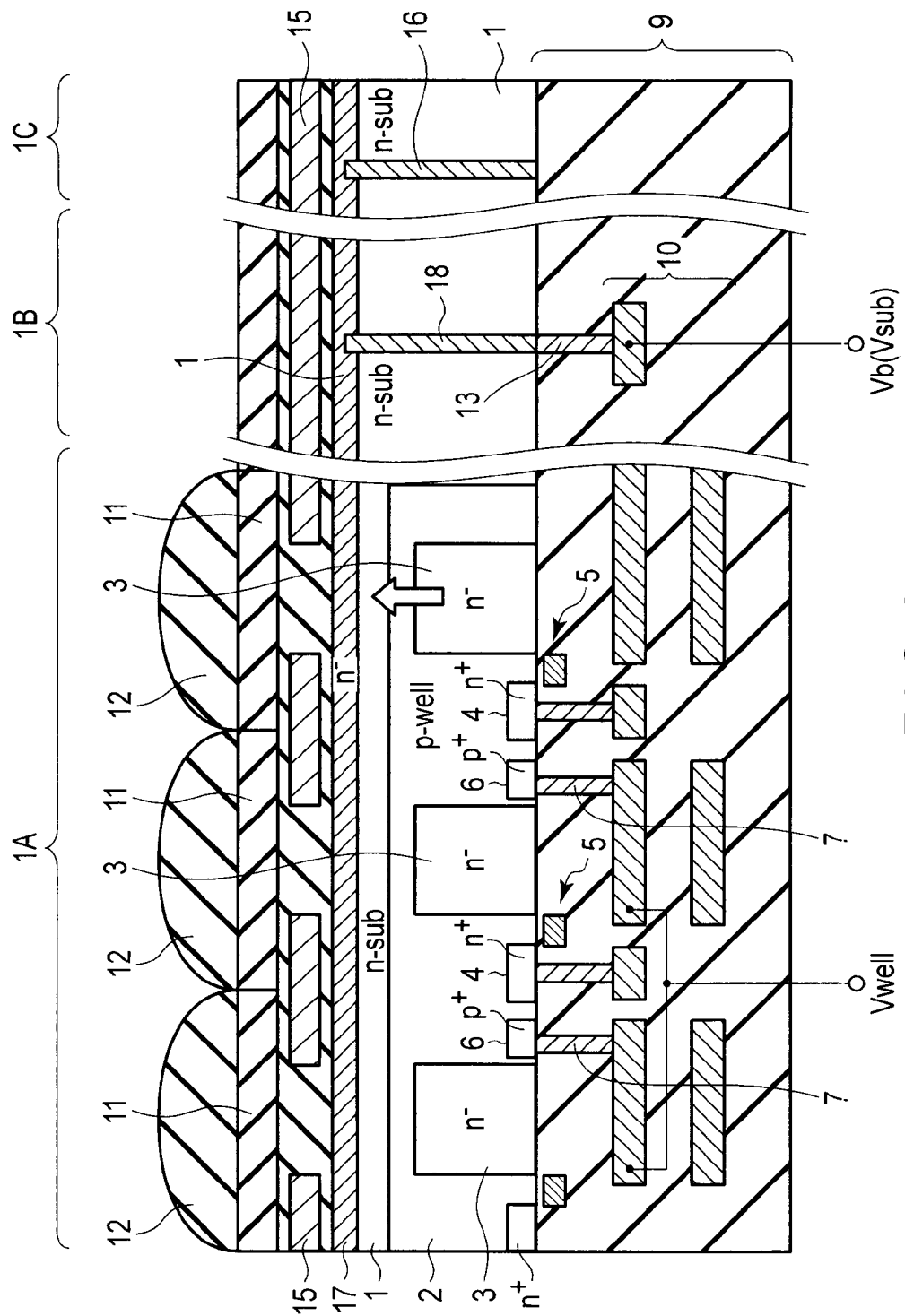
FIG. 8 is a view showing a third embodiment of the back side illumination type solid state imaging device.

FIG. 8 shows a third embodiment of the back side illumination type solid state imaging device.

This embodiment is an example in which semiconductor substrate 1 is of an n type, p-type well region 2 is formed in this n-type semiconductor substrate 1, and n-type photodiodes 3 are formed in p-type well region 2. It is to be noted that counterchanging the n type and the p type provides an example in which p-type photodiodes are formed in an n-type well region in a p-type semiconductor substrate.

N-type semiconductor substrate 1 is, e.g., a silicon substrate. Semiconductor substrate 1 includes pixel area 1A, peripheral circuit area 1B, and alignment mark area (a scribe line) 10.

N−-type impurity layer, i.e., overflow drain layer 17 that realizes a vertical overflow drain configuration is arranged on a back surface side of semiconductor substrate 1. The impurity concentration of overflow drain layer 17 is higher than the impurity concentration of semiconductor substrate 1. That is, overflow drain layer 17 has a lower resistance than that of semiconductor substrate 1.

Like the first embodiment, overflow drain layer 17 can be constituted of a diffusion layer in semiconductor substrate 1 or conductive layer on the back surface of semiconductor substrate 1.

In pixel area 1A, p-type well region 2 is formed in n-type semiconductor substrate 1. Photodiodes 3 and n-type floating diffusions 4 are formed in p-type well region 2. Further, read transistors 5 read electric charges in photodiodes 3 to floating diffusions 4.

Electrodes 7 configured to supply a potential to p-type well region 2 are connected to high-concentration p+-type diffusion layers 6 for substrate contact. A well potential Vwell is applied to p-type well region 2 through electrodes 7 and p+-type diffusion layers 6.

Here, electrodes 7 can be provided in pixel area 1A. For example, when one p+-type diffusion layer (a well contact portion) 6 is provided with respect to one pixel, a potential in p-type well region 2 can be stabilized.

Wiring layer 9 is formed on a front surface side of semiconductor substrate 1. Since light enters photodiodes 3 from the back surface side of semiconductor substrate 1, conductive lines 10 can be provided on the entire front surface of semiconductor substrate 1.

In peripheral circuit area 1B, overflow drain electrode 18 extends toward overflow drain layer 17 from the front surface side of semiconductor substrate 1 and electrically comes into contact with overflow drain layer 17. Electrode 13 provided on the front surface side of semiconductor substrate 1 is in contact with overflow drain electrode 18.

Therefore, when a bias potential Vb is applied to electrode 13, the bias potential Vb is transmitted to overflow drain layer 17 through overflow drain electrode 18.

As a result, the vertical overflow drain configuration is realized.

It is to be noted that overflow drain electrode 18 may be a piercing electrode that pierces semiconductor substrate 1, but a desirable configuration is that overflow drain electrode 18 does not pierce overflow drain layer 17, i.e., an end portion of overflow drain electrode 18 is present in overflow drain layer 17.

Color filters 11 and microlenses 12 are arranged on the back surface side of semiconductor substrate 1. Further, to lead light to photodiodes 3 alone, light shielding film 15 having openings above photodiodes 3 is provided between semiconductor substrate 1 and color filters 11.

Furthermore, in semiconductor substrate 1, alignment mark 16 is provided in alignment mark area 1C. This alignment mark 16 is used as a positioning member when disposing color filters 11, microlenses 12, and light shielding film 15 to the back surface side of semiconductor substrate 1.

Figure 9:
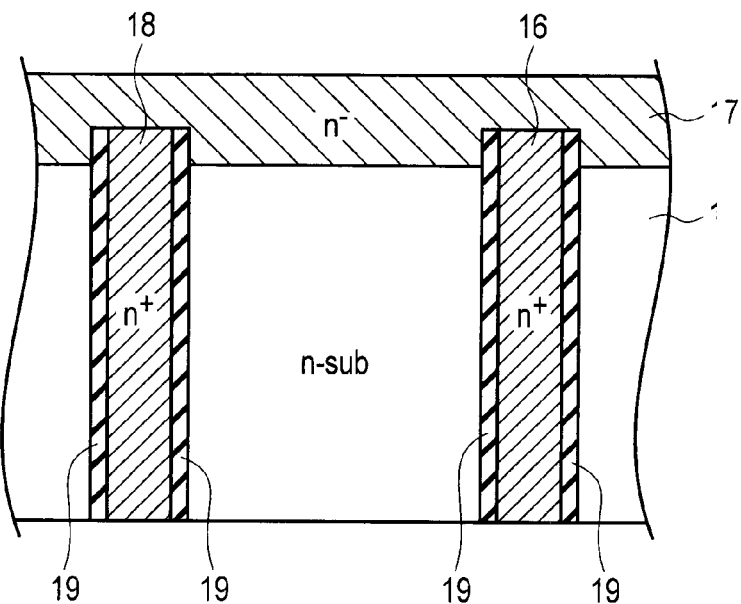
FIG. 9 is a view showing an overflow drain electrode.

Thus, for example, as shown in FIG. 9, when alignment mark 16 has the same structure as overflow drain electrode 18 and they are simultaneously formed, the novel vertical overflow drain configuration can be realized without a great increase in cost due to an increase in the number of manufacturing steps.

As shown in the drawing, for example, each of alignment mark 16 and overflow drain electrode 18 can be constituted of a conductive silicon layer (an n+-type impurity layer) containing n-type impurities filling each trench in semiconductor substrate 1. Insulating layer (e.g., a silicon oxide layer) 19 configured to insulate the conductive silicon Layer from semiconductor substrate 1 is arranged on an inner surface of the trench in semiconductor substrate 1.

It is to be noted that each of alignment mark 16 and overflow drain electrode 18 may be made of a metal or an alloy. Moreover, it is desirable to provide insulating layer 19 on the trench inner surface, but insulating layer 19 may be omitted.

Additionally, in the third embodiment, when overflow drain layer 17 is constituted of a conductive silicon layer containing impurities, to reduce the apparent substrate resistance by increasing the impurity concentration in the overflow drain layer, like the first embodiment, it is desirable to set the impurity concentration in overflow drain layer 17 to be higher than the impurity concentration in semiconductor substrate 1 (e.g., $1 \times 10^{13}$ cm$^{-3}$ to $1 \times 10^{17}$ cm$^{-3}$) and lower than the impurity concentration in source/drain diffusion layers of transistors (e.g., $1\times10^{19}$ cm$^{-3}$ to $1\times10^{20}$ cm$^{-3}$) and increase a layer thickness of the overflow drain layer.

Further, when overflow drain electrode 18 is constituted of a conductive silicon layer containing impurities, it is desirable for the impurity concentration in overflow drain electrode 18 to be higher than the impurity concentration in overflow drain layer 17.

As described above, according to the third embodiment, the vertical overflow drain configuration is constituted of n-type photodiodes 3, p-type well region 2, and n-type semiconductor substrate 1. On the entire back surface side of n-type semiconductor substrate 1 is arranged n-type overflow drain Layer 17 having the higher impurity concentration than that of the n-type semiconductor substrate 1.

Therefore, the well potential Vwell can be supplied from electrodes 7 in pixel area 1A to p-type well region 2, whereby the potential in p-type well region 2 can be stabilized. Further, since a bias potential (a substrate potential Vsub) can be supplied to overflow drain layer 17 from overflow drain electrode 18, the potential in n-type semiconductor substrate 1 can be stabilized.

As a result, electrons overflowing from photodiodes 3 can be discharged to overflow drain layer 17, thereby effectively preventing blooming. However, a vertical potential barrier of photodiodes 3 must be adjusted to be smaller than a lateral potential barrier of photodiodes 3.

A manufacturing method of a solid state imaging device according to the foregoing embodiments will now be described.

This manufacturing method is characterized firstly in a forming method of an overflow drain layer having the same conductivity type as photodiodes and secondly in a forming method of an overflow drain electrode that supplies a bias potential to the overflow drain layer.

Figure 10A:
FIG. 10A to FIG. 10P are views showing a method of manufacturing a back side illumination type solid state imaging device.

First, as shown in FIG. 10A, semiconductor substrate (e.g., a silicon substrate) 1 having the impurity concentration (e.g., the n-type impurity concentration) of, e.g., $1\times10^{13}$ cm$^{-3}$ to $1\times10^{17}$ cm$^{-3}$ is prepared.

Figure 10B:
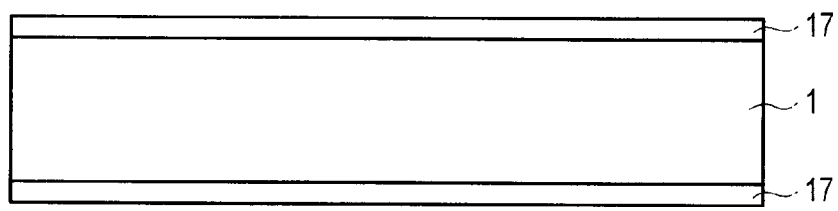

Then, as shown in FIG. 10B, overflow drain layers 17 constituted of a conductive silicon layer having impurities doped therein are formed on a front surface and a back surface of semiconductor substrate 1, respectively. The impurity concentration in each overflow drain layer 17 is set to be higher than the impurity concentration in semiconductor substrate 1.

Overflow drain layers 17 are formed on the entire front surface and the entire back surface of semiconductor substrate 1, respectively.

Subsequently, as shown in FIG. 10C, mark oxide films 20 are formed on the front surface and the back surface of semiconductor substrate 1 by an oxidation furnace or a CVD method, respectively. Mark oxide film 20 is made of, e.g., TEOS (Tetraethyl Ortho-silicate)-NSG (Non-doped Silicate glass). A thickness of mark oxide film 20 is sufficiently reduced so that a later-described alignment mark can be recognized from the back surface side of semiconductor substrate 1.

Then, as shown in FIG. 10D, a back surface protective film 21 is deposited on the back surface side of semiconductor substrate 1. At this step, differing from a batch process based on the CVD method, the back surface side of semiconductor substrate 1 is determined as the upper side in a single-wafer processing system for processing wafers one by one, thereby preventing back surface protective film 21 from being deposited on the front surface side of semiconductor substrate 1. Back surface side protective film 21 is made of, e.g., silicon oxide or a photoresist.

Figure 10F:
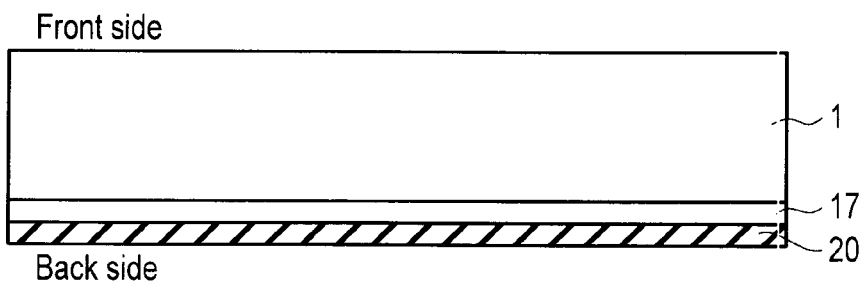

Thereafter, when mark oxide film 20 and overflow drain layer 17 provided on the front surface side of semiconductor substrate 1 are removed by an HF (hydrogen fluoride) treatment, a configuration depicted in FIG. 10E can be obtained. Subsequently, when back surface protective film 21 in FIG. 10E is removed by etching, a configuration depicted in FIG. 10F can be obtained.

The front surface side (the upper side in the drawing) of semiconductor substrate 1 alone will now be described.

It is to be noted that, when depositing a film on the front surface side of semiconductor substrate 1 by the CVD, this film is also formed on the back surface side, but the film deposited on mark oxide film 20 on the back surface side is all removed at the last step, and hence the front surface side of semiconductor substrate 1 alone will be described for ease of explanation.

First, laser marking is carried out on the front surface side of semiconductor substrate 1 to engrave a lot number and the like.

Figure 10G:
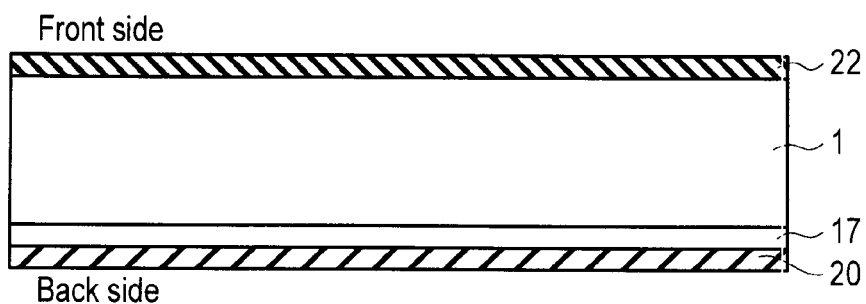

Then, as shown in FIG. 10G, stopper insulating layer 22 is formed on the front surface side of semiconductor substrate 1. Stopper insulating layer 22 is made of, e.g., a silicon nitride.

Figure 10H:
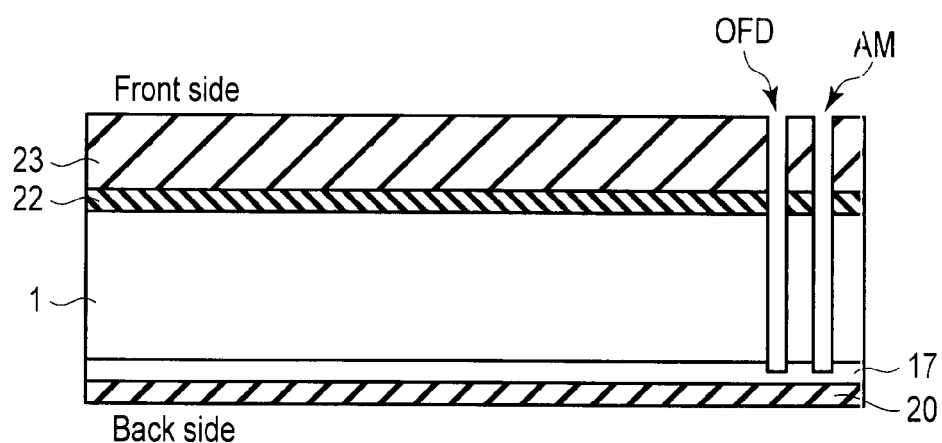

Subsequently, as shown in FIG. 10H, a photoresist 23 is applied to stopper insulating layer 22 on the front surface side of semiconductor substrate 1, and photoresist 23 is patterned by PEP (photo engraving process).

Further, photoresist 23 is used as a mask to etch stopper insulating layer 22 and semiconductor substrate 1, whereby trenches reaching overflow drain layer 17 from the front surface side of semiconductor substrate 1 are formed in an overflow drain area OFD and an alignment mark area AM.

Here, it is desirable to stop the etching for formation of the trenches at overflow drain layer 17. That is, it is desirable for bottom surfaces of the trenches to be present in overflow drain layer 17.

To realize this configuration, a larger thickness of overflow drain layer 17 is desirable. Furthermore, as described above, since a resistance value is in inverse proportion to an area, it is desirable for overflow drain layer 17 to have a larger thickness for a reduction in apparent substrate resistance. However, when a thickness of overflow drain layer 17 is extremely large, since a wavelength of light is 300 nm to 750 nm, the light is absorbed by this layer, and a light concentration factor with respect to the photodiodes is reduced. Thus, the thickness of overflow drain layer 17 is set to a film thickness that does not affect the light concentration, e.g., 0.05 μm to 0.3 μm.

Then, when photoresist 23 is removed, a configuration shown in FIG. 10I can be obtained.

Subsequently, as shown in FIG. 10J, insulating layer 19 that covers inner surfaces of the trenches in the overflow drain area OFD and the alignment mark area AM is formed. This insulating layer 19 is made of, e.g., silicon oxide, and it can be formed by the CVD method or a thermal oxidation method.

However, since insulating layer 19 is also formed on the bottom surfaces of the trenches, etching back is carried out after forming insulating layer 19 to remove insulating layer 19 provided on the bottom surfaces of the trenches.

It is to be noted that FIG. 10J is an enlarged view of a region X in FIG. 10I.

Then, as shown in FIG. 10K, stopper insulating layer 22 is used as a mask to implant ions to the bottom surfaces of the trenches from the front surface side of semiconductor substrate 1, thereby forming contact regions 17' for overflow drain layer 17.

A conductivity type of impurities introduced by this ion implantation is equal to a conductivity type of impurities in the conductive silicon layer constituting overflow drain layer 17.

Figure 10L:
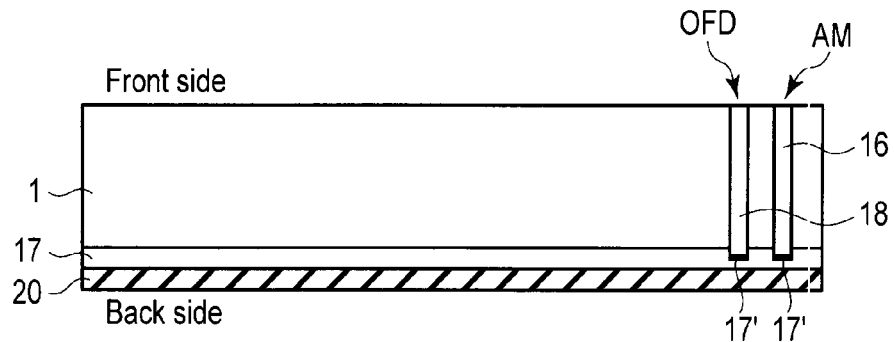

Then, as shown in FIG. 10L, the trenches are filled with conductive layers by the CVD method. The conductive layer in the overflow drain region DFD is formed as overflow drain electrode 18, and the conductive layer in the alignment mark region AM is formed as alignment mark 16.

This conductive layer is, e.g., a conductive silicon layer having impurities with the same conductivity type as that of overflow drain layer 17 doped therein. The impurity concentration in the conductive silicon layer constituting overflow drain electrode 18 is set to, e.g., $5 \times 10^{19}$ cm$^{-3}$ or above, which is higher than the concentration in overflow drain layer 17.

This impurity concentration is set to reduce the resistance of overflow drain electrode 18 and fill the trench with a high aspect ratio with the conductive silicon layer with an excellent coverage.

Thereafter, the conductive silicon layer provided outside the trenches is removed by CMP (Chemical Mechanical Polishing), and upper surfaces of alignment mark 16 and overflow drain electrode 18 in the trenches are flattened. Stopper insulating layer 22 functions as a stopper in this CMP.

Figure 10M:
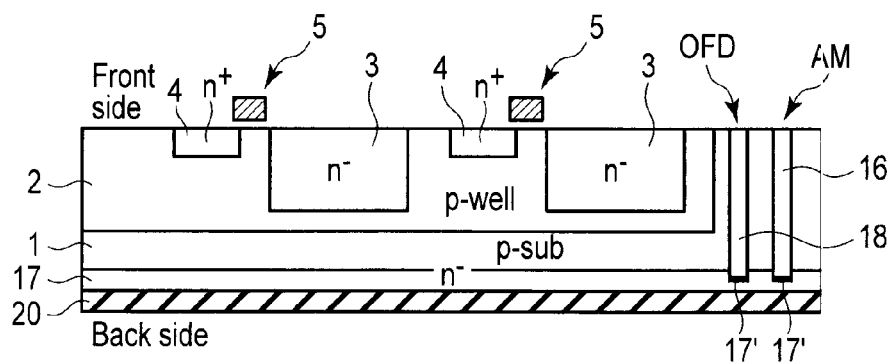
Figure 10N:
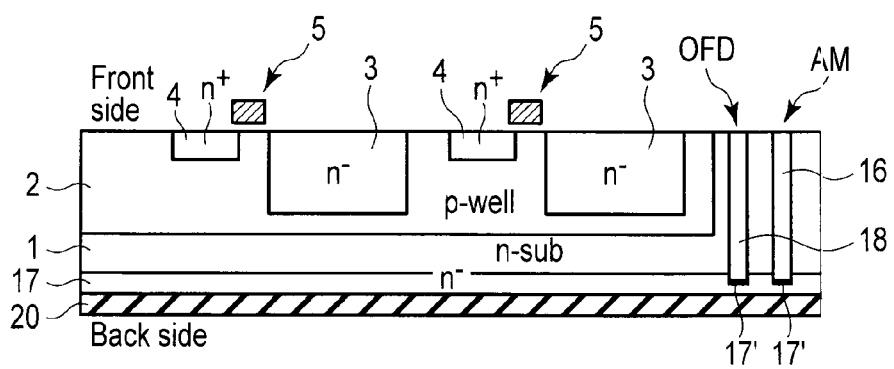
Figure 10:
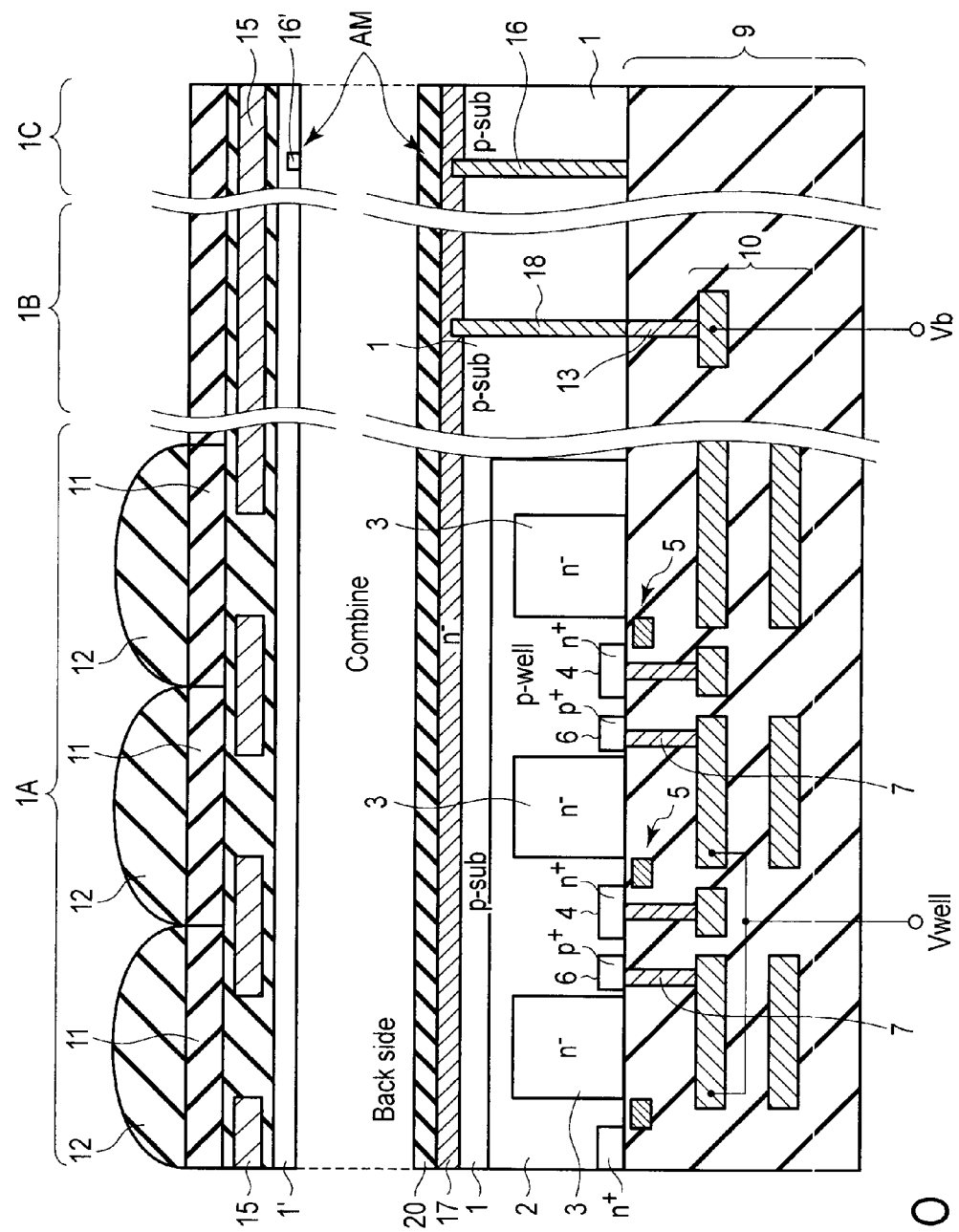

Subsequently, as shown in FIG. 10M and FIG. 10N, a remaining wafer process is carried out on the front surface side of semiconductor substrate 1.

For example, as shown in FIG. 10M, when semiconductor substrate 1 is of a p type, p-type well region 2, n-type photodiodes 3, n-type floating diffusions 4, and read transistors (n-channel-type MOSFETs) 5 are formed on the front surface side of semiconductor substrate 1. At this time, each of alignment mark 16, overflow drain layer 17, and overflow drain electrode 18 becomes a conductive silicon layer containing n-type impurities (e.g., phosphor).

The above-described configuration is associated with the solid state imaging device depicted in FIG. 2.

Further, for example, as shown in FIG. 10N, when semiconductor substrate 1 is of the n type, p-type well region 2, n-type photodiodes 3, n-type floating diffusions 4, and read transistors (n-channel-type MOSFETs) 5 are formed on the front surface side of semiconductor substrate 1 like the example shown in FIG. 10M. At this time, each of alignment mark 16, overflow drain layer 17, and overflow drain electrode 18 is a conductive silicon layer containing n-type impurities (e.g., phosphor).

The above-described configuration is associated with the solid state imaging device depicted in FIG. 8.

Figure 10P:
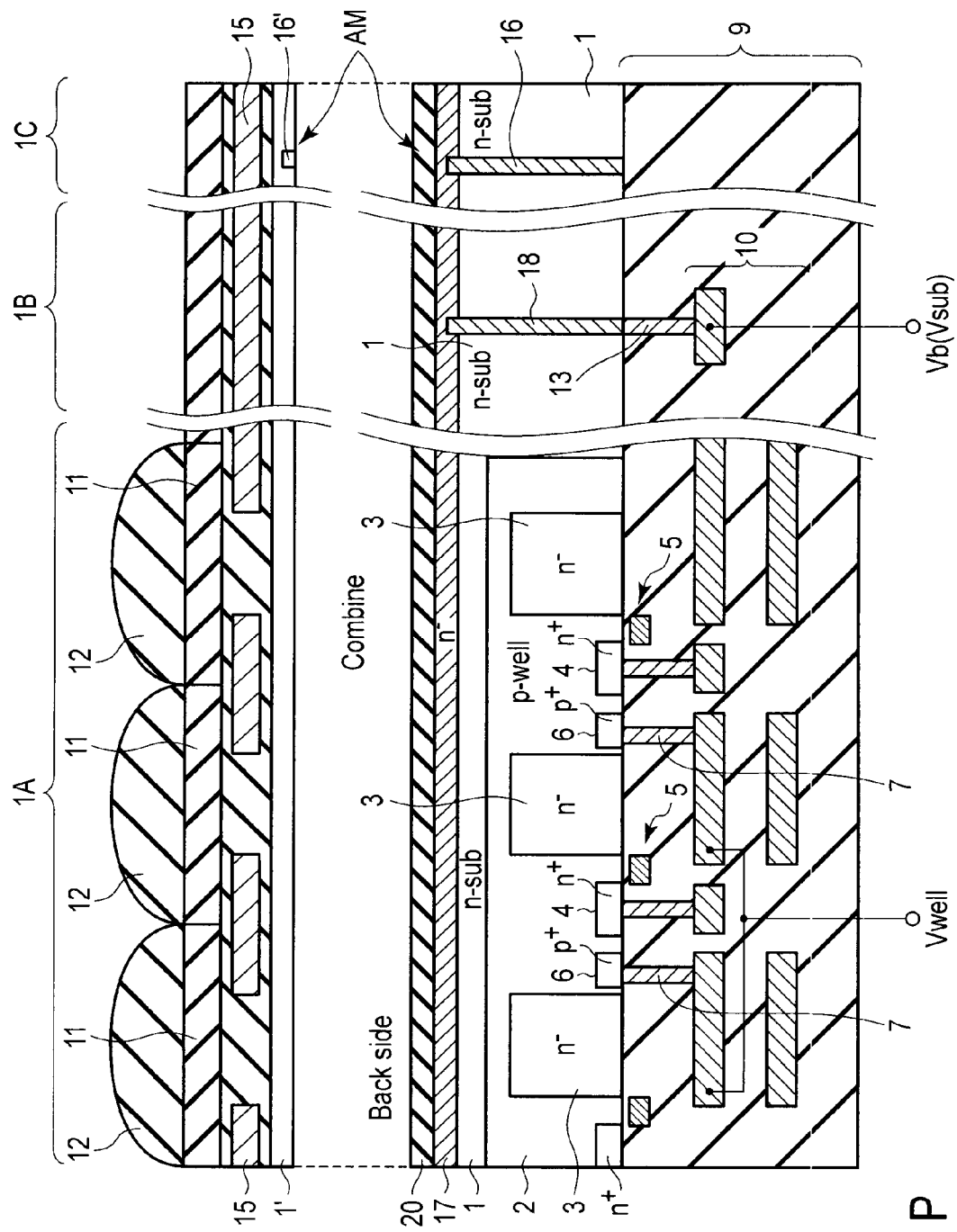

At last, as shown in FIG. 10O and FIG. 10P, a structure which is formed separately from the above-described process and contains color filters 11, microlenses 12, and light shielding film 15 is bonded to the back surface of semiconductor substrate 1.

At this time, mark oxide film 20 on the back surface side of semiconductor substrate 1 is very thin, and alignment mark 16 can be recognized from the back surface side of semiconductor substrate 1. Therefore, alignment mark 16 in semiconductor substrate 1 and alignment mark 16' in semiconductor substrate 1 on the structure side can be used to perform positioning of these substrates.

Based on the above-described process, the solid state imaging device in FIG. 2 is brought to completion as shown in FIG. 10O, and the solid state imaging device in FIG. 8 is brought to completion as shown in FIG. 10P.

According to this process, before forming the well region, diffusion layer, or the transistors on the front surface side of semiconductor substrate 1, overflow drain layer 17 having the higher impurity concentration than that of the semiconductor substrate and overflow drain electrode 18 configured to supply a bias potential to overflow drain layer 17 from the front surface side of semiconductor substrate 1 can be formed on the back surface side of semiconductor substrate 1 in advance.

As a result, since a substrate potential or a well potential can be supplied from electrodes 7 in pixel area 1A and peripheral circuit area 1B, the suostrate potential or the well potential can be stabilized. Furthermore, since the bias potential can be supplied to overflow drain layer from overflow drain electrode, electrons overflowing from photodiodes 3 can be discharged to overflow drain layer, thereby effectively preventing blooming.

As described above according to the embodiments, in the back side illumination type solid state imaging device, the potential in the semiconductor substrate (including the well) can be stabilized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A back side illumination type solid state imaging device comprising:
   a semiconductor substrate having a first conductivity type;
   a well region which is arranged on a front surface side of the semiconductor substrate and has the first conductivity type;
   photodiodes which are arranged in the well region and have a second conductivity type;
   a diffusion layer which is arranged between the photodiodes, supplies a potential to the well region, and has the first conductivity type;
   an overflow drain layer which is arranged on a back surface side of the semiconductor substrate and has the second conductivity type;
   an overflow drain electrode which extends from the front surface side of the semiconductor substrate to the overflow drain layer and supplies a bias potential to the overflow drain layer from the front surface side of the semiconductor substrate; and
   a wiring layer which is arranged on the front surface of the semiconductor substrate.

2. The device of claim 1, further comprising:
   a light shielding film, a color filter, and a microlens which are arranged on the back surface of the semiconductor substrate.

3. The device of claim 1, further comprising:
   an alignment mark extending from the front surface side of the semiconductor substrate to the overflow drain layer,
   wherein the overflow drain electrode has the same structure as that of the alignment mark.

4. The device of claim 1, further comprising:
   a trench in the semiconductor substrate; and
   an insulating layer covering an inner surface of the trench,
   wherein the overflow drain electrode has a conductive silicon layer that fills the trench.

5. The device of claim 1,
   wherein the overflow drain electrode is arranged between the photodiodes in a pixel area including the well region.

6. The device of claim 1,
wherein the overflow drain electrode is arranged in a peripheral circuit area which does not include the well region.

7. The device of claim 1,
wherein the overflow drain layer is arranged on the entire back surface of the semiconductor substrate and has a thickness of 0.05 µm to 0.3 µm.

8. The device of claim 1, further comprising:
a diffusion layer which supplies a potential to the semiconductor substrate and has the first conductivity type.

9. A method of manufacturing the device of claim 1, the method comprising:
forming the overflow drain layer by depositing a conductive silicon layer having a higher impurity concentration than that of the semiconductor substrate on the back surface of the semiconductor substrate;
forming the overflow drain electrode and an alignment mark simultaneously by forming a trench in the semiconductor substrate and filling the trench with a conductive layer; and
forming photodiodes and the diffusion layer after forming the overflow drain layer and the overflow drain electrode.

10. The method of claim 9, further comprising:
executing an alignment by using the alignment mark to form a light shielding film, a color filter, and a microlens on the back surface of the semiconductor substrate.

11. A back side illumination type solid state imaging device comprising:
a semiconductor substrate having a first conductivity type;
a well region which is arranged on a front surface side of the semiconductor substrate and has a second conductivity type;
photodiodes which are arranged in the well region and have the first conductivity type;
a diffusion layer which is arranged between the photodiodes, supplies a potential to the well region, and has the second conductivity type;
an overflow drain layer which is arranged on a back surface side of the semiconductor substrate and has the first conductivity type;
an overflow drain electrode which extends from the front surface side of the semiconductor substrate to the overflow drain layer and supplies a bias potential to the overflow drain layer from the front surface side of the semiconductor substrate; and
a wiring layer which is arranged on the front surface of the semiconductor substrate.

12. The device of claim 11, further comprising:
a light shielding film, a color filter, and a microlens which are arranged on the back surface of the semiconductor substrate.

13. The device of claim 11, further comprising:
an alignment mark extending from the front surface side of the semiconductor substrate to the overflow drain layer,
wherein the overflow drain electrode has the same structure as that of the alignment mark.

14. The device of claim 11, further comprising:
a trench in the semiconductor substrate; and
an insulating layer covering an inner surface of the trench,
wherein the overflow drain electrode has a conductive silicon layer that fills the trench.

15. The device of claim 11,
wherein the overflow drain electrode is arranged between the photodiodes in a pixel area including the well region.

16. The device of claim 11,
wherein the overflow drain electrode is arranged in a peripheral circuit area which does not include the well region.

17. The device of claim 11,
wherein the overflow drain layer is arranged on the entire back surface of the semiconductor substrate and has a thickness of 0.05 µm to 0.3 µm.

18. The device of claim 11, further comprising:
a diffusion layer which supplies a potential to the semiconductor substrate and has the first conductivity type.

19. A method of manufacturing the device of claim 11, the method comprising:
forming the overflow drain layer by depositing a conductive silicon layer having a higher impurity concentration than that of the semiconductor substrate on the back surface of the semiconductor substrate;
forming the overflow drain electrode and an alignment mark simultaneously by forming a trench in the semiconductor substrate and filling the trench with a conductive layer; and
forming photodiodes and the diffusion layer after forming the overflow drain layer and the overflow drain electrode.

20. The method of claim 19, further comprising:
executing an alignment by using the alignment mark to form a light shielding film, a color filter, and a microlens on the back surface of the semiconductor substrate.

* * * * *